(12) United States Patent
Elliott et al.

(10) Patent No.: US 7,720,558 B2
(45) Date of Patent: May 18, 2010

(54) METHODS AND APPARATUS FOR MAPPING CARRIER CONTENTS

(75) Inventors: Martin R. Elliott, Pepperell, MA (US); Vinay Shah, San Mateo, CA (US)

(73) Assignee: Applied Materials, Inc., Santa Clara, CA (US)

( * ) Notice: Subject to any disclaimer, the term of this patent is extended or adjusted under 35 U.S.C. 154(b) by 1038 days.

(21) Appl. No.: 11/220,897

(22) Filed: Sep. 6, 2005

(65) Prior Publication Data

US 2006/0051184 A1 Mar. 9, 2006

Related U.S. Application Data

(60) Provisional application No. 60/607,288, filed on Sep. 4, 2004.

(51) Int. Cl.
*G06F 19/00* (2006.01)
*H01L 21/677* (2006.01)
*B65G 1/133* (2006.01)

(52) U.S. Cl. .................... 700/115; 414/217; 414/217.1; 414/274

(58) Field of Classification Search ......... 700/112–116, 700/213, 217, 218; 414/222.01, 222.02, 414/222.04, 222.05, 266–270, 274, 217, 414/217.1; 438/14, 16–18
See application file for complete search history.

(56) References Cited

U.S. PATENT DOCUMENTS

| | | | |
|---|---|---|---|
| 4,422,547 A * | 12/1983 | Abe et al. ................... 206/454 |
| 4,449,885 A | 5/1984 | Hertel et al. | |
| 4,522,697 A | 6/1985 | Dimock et al. | |
| 4,523,985 A | 6/1985 | Dimock | |
| 4,538,253 A * | 8/1985 | Ishibashi et al. ........... 369/30.3 |
| 4,539,663 A * | 9/1985 | Ishibashi et al. ......... 369/30.35 |
| 4,594,700 A * | 6/1986 | Takahashi et al. ........ 369/30.89 |
| 4,640,223 A | 2/1987 | Dozier | |
| 4,684,021 A | 8/1987 | Niebling et al. | |
| 4,687,542 A | 8/1987 | Davis et al. | |
| 4,756,815 A | 7/1988 | Turner et al. | |
| 4,776,744 A | 10/1988 | Stonestreet et al. | |
| 4,836,733 A | 6/1989 | Hertel et al. | |
| 4,842,680 A | 6/1989 | Davis et al. | |

(Continued)

FOREIGN PATENT DOCUMENTS

EP 0365589 B1 9/1992

(Continued)

OTHER PUBLICATIONS

Page, et al., "Robotic Wafer Handling and Inspection in the IC Fab", Jul. 1990, Microelectronic Manufacturing and Testing, vol. 13, No. 8, pp. 27-28.

(Continued)

*Primary Examiner*—M. N. Von Buhr
(74) *Attorney, Agent, or Firm*—Dugan & Dugan

(57) ABSTRACT

In a first aspect, a first method of mapping contents of a substrate carrier is provided. The first method includes the steps of (1) coupling a sensor to the substrate carrier or a loadport adapted to receive the substrate carrier; and (2) determining a presence or absence of a substrate in a slot of the substrate carrier using the sensor. Numerous other aspects are provided.

21 Claims, 4 Drawing Sheets

U.S. PATENT DOCUMENTS

| | | |
|---|---|---|
| 4,859,137 A | 8/1989 | Bonora et al. |
| 4,861,222 A | 8/1989 | Mirkovich |
| 4,875,824 A | 10/1989 | Moe et al. |
| 4,886,412 A | 12/1989 | Wooding et al. |
| 4,954,721 A * | 9/1990 | Suzuki .................... 250/559.4 |
| 5,000,208 A | 3/1991 | Ludwig et al. |
| 5,169,272 A | 12/1992 | Bonora et al. |
| 5,184,723 A | 2/1993 | Karl et al. |
| 5,224,503 A | 7/1993 | Thompson et al. |
| 5,225,691 A * | 7/1993 | Powers et al. ............ 250/559.4 |
| 5,256,204 A | 10/1993 | Wu |
| 5,360,106 A | 11/1994 | Nakayama et al. |
| 5,370,491 A | 12/1994 | Bonora et al. |
| 5,372,471 A | 12/1994 | Wu |
| 5,452,795 A | 9/1995 | Gallagher et al. |
| 5,482,161 A | 1/1996 | Williams et al. |
| 5,562,113 A | 10/1996 | Thompson et al. |
| 5,570,987 A | 11/1996 | McKenna |
| 5,607,276 A | 3/1997 | Muka et al. |
| 5,615,988 A | 4/1997 | Wiesler et al. |
| 5,636,960 A * | 6/1997 | Hiroki et al. ................ 414/781 |
| 5,664,925 A | 9/1997 | Muka et al. |
| 5,668,056 A | 9/1997 | Wu et al. |
| 5,674,039 A | 10/1997 | Walker et al. |
| 5,690,744 A | 11/1997 | Landau |
| 5,711,427 A | 1/1998 | Nyseth |
| 5,713,711 A | 2/1998 | McKenna et al. |
| 5,716,258 A | 2/1998 | Metcalf |
| 5,727,685 A * | 3/1998 | Laganza et al. ............. 206/455 |
| 5,738,128 A | 4/1998 | Thompson et al. |
| 5,743,409 A * | 4/1998 | Nakahara et al. ............ 206/710 |
| 5,752,796 A | 5/1998 | Muka |
| 5,765,444 A | 6/1998 | Bacchi et al. |
| 5,772,386 A * | 6/1998 | Mages et al. ................ 414/411 |
| 5,784,797 A | 7/1998 | Curtis et al. |
| 5,785,186 A | 7/1998 | Babbs et al. |
| 5,788,082 A | 8/1998 | Nyseth |
| 5,788,454 A | 8/1998 | Thompson et al. |
| 5,843,196 A | 12/1998 | Leavey et al. |
| 5,864,522 A * | 1/1999 | Sugano et al. ........... 369/30.29 |
| 5,868,609 A | 2/1999 | Aaron et al. |
| 5,870,488 A | 2/1999 | Rush et al. |
| 5,888,042 A | 3/1999 | Oda |
| 5,915,562 A | 6/1999 | Nyseth et al. |
| 5,931,631 A | 8/1999 | Bonora et al. |
| 5,944,857 A | 8/1999 | Edwards et al. |
| 5,950,643 A | 9/1999 | Miyazaki et al. |
| 5,972,127 A | 10/1999 | Thompson et al. |
| 5,976,199 A | 11/1999 | Wu et al. |
| 5,980,183 A | 11/1999 | Fosnight |
| 6,010,008 A | 1/2000 | Nyseth et al. |
| 6,010,399 A | 1/2000 | Lee et al. |
| 6,013,920 A * | 1/2000 | Gordon et al. ......... 250/559.36 |
| 6,014,817 A | 1/2000 | Thompson et al. |
| 6,042,324 A | 3/2000 | Aggarwal et al. |
| 6,048,259 A | 4/2000 | Asai |
| 6,053,688 A | 4/2000 | Cheng |
| 6,053,983 A * | 4/2000 | Saeki et al. ................. 118/728 |
| 6,120,119 A | 9/2000 | Jelinski et al. |
| 6,120,229 A | 9/2000 | Hofmeister |
| 6,135,168 A | 10/2000 | Yang et al. |
| 6,135,698 A | 10/2000 | Bonora et al. |
| 6,147,356 A * | 11/2000 | Hahn et al. ............. 250/559.29 |
| 6,160,265 A | 12/2000 | Bacchi et al. |
| 6,165,268 A | 12/2000 | Ow et al. |
| 6,166,392 A | 12/2000 | Chang et al. |
| 6,183,186 B1 | 2/2001 | Howells et al. |
| 6,188,323 B1 * | 2/2001 | Rosenquist et al. ....... 340/686.5 |
| 6,206,196 B1 | 3/2001 | Krampotich et al. |
| 6,216,874 B1 | 4/2001 | Bores et al. |
| 6,256,555 B1 | 7/2001 | Bacchi et al. |
| 6,267,245 B1 | 7/2001 | Bores et al. |
| 6,275,748 B1 | 8/2001 | Bacchi et al. |
| 6,281,516 B1 | 8/2001 | Bacchi et al. |
| 6,326,614 B1 | 12/2001 | Bacchi et al. |
| 6,338,409 B1 | 1/2002 | Neary |
| 6,360,144 B1 | 3/2002 | Bacchi et al. |
| 6,366,830 B2 | 4/2002 | Bacchi et al. |
| 6,438,460 B1 | 8/2002 | Bacchi et al. |
| 6,453,214 B1 | 9/2002 | Bacchi et al. |
| 6,501,070 B1 | 12/2002 | Bacchi et al. |
| 6,532,866 B2 * | 3/2003 | Perlov et al. ................ 700/229 |
| 6,563,771 B1 * | 5/2003 | Debiez ..................... 369/30.79 |
| 6,579,052 B1 | 6/2003 | Bonora et al. |
| 6,592,673 B2 * | 7/2003 | Welch et al. ................ 118/676 |
| 6,618,645 B2 | 9/2003 | Bacchi et al. |
| 6,658,321 B2 * | 12/2003 | Osaka et al. ................ 700/218 |
| 6,663,762 B2 * | 12/2003 | Bleck et al. ................ 205/123 |
| 6,717,171 B2 * | 4/2004 | Harris et al. ............. 250/559.4 |
| 6,761,806 B2 * | 7/2004 | Hanson .................... 204/224 R |
| 6,765,222 B2 | 7/2004 | Bacchi et al. |
| 6,795,202 B2 * | 9/2004 | Emoto et al. ................ 356/630 |
| 6,805,778 B1 * | 10/2004 | Batz et al. ................ 204/297.1 |
| 6,815,661 B2 | 11/2004 | Bacchi et al. |
| 6,827,825 B2 * | 12/2004 | Feltsman et al. ........ 204/192.13 |
| 6,897,463 B1 * | 5/2005 | Cole et al. .............. 250/559.29 |
| 6,898,487 B2 | 5/2005 | Bacchi et al. |
| 6,936,153 B1 * | 8/2005 | Ritzdorf ...................... 205/123 |
| 6,984,839 B2 * | 1/2006 | Igarashi et al. ......... 250/559.33 |
| 7,039,498 B2 | 5/2006 | Bacchi et al. |
| 7,051,870 B2 | 5/2006 | Schoendienst et al. |
| 7,102,124 B2 | 9/2006 | Bacchi et al. |
| 7,105,847 B2 * | 9/2006 | Oka ....................... 250/559.33 |
| 7,109,509 B2 * | 9/2006 | Gilchrist et al. ........ 250/559.29 |
| 7,202,491 B2 * | 4/2007 | Garssen et al. ......... 250/559.29 |
| 7,206,663 B2 * | 4/2007 | Teng et al. .................. 700/218 |
| 7,246,985 B2 * | 7/2007 | Ferrara ....................... 414/217 |
| 7,255,524 B2 * | 8/2007 | Hofmeister et al. ....... 414/217.1 |
| 2002/0111710 A1 * | 8/2002 | Perlov et al. ................ 700/229 |
| 2003/0029732 A1 * | 2/2003 | Ritzdorf et al. .............. 205/157 |
| 2003/0062578 A1 * | 4/2003 | Dougan et al. ............... 257/414 |
| 2003/0110649 A1 * | 6/2003 | Hudgens et al. ............... 33/286 |
| 2003/0173511 A1 * | 9/2003 | Bacchi et al. ................ 250/239 |
| 2004/0035707 A1 * | 2/2004 | Batz et al. .................... 205/123 |
| 2004/0213648 A1 * | 10/2004 | Hofmeister et al. .......... 414/217 |
| 2006/0045719 A1 | 3/2006 | Bacchi et al. |
| 2007/0215481 A1 * | 9/2007 | Graham et al. ............... 205/123 |
| 2008/0156689 A1 | 7/2008 | Koshti et al. |

FOREIGN PATENT DOCUMENTS

| | | |
|---|---|---|
| EP | 0513651 A1 | 11/1992 |
| EP | 0267233 B1 | 1/1993 |
| EP | 0609105 A1 | 8/1994 |
| EP | 0219826 B1 | 9/1994 |
| EP | 0244202 B1 | 9/1994 |
| EP | 0472536 B1 | 12/1994 |
| EP | 0651429 A1 | 5/1995 |
| EP | 0556193 B1 | 12/1995 |
| EP | 0690480 A1 | 1/1996 |
| EP | 0676086 B1 | 5/1996 |
| EP | 0663686 B1 | 6/1997 |
| EP | 0795892 A1 | 9/1997 |
| EP | 0684631 B1 | 4/1998 |
| EP | 0555891 B1 | 1/1999 |
| EP | 0690480 B1 | 3/2002 |
| JP | 07-117814 A * | 5/1995 |
| JP | 08046005 A | 2/1996 |
| JP | 08139153 A | 5/1996 |
| JP | 10041368 A | 2/1998 |
| JP | 10144764 A | 5/1998 |
| JP | 10321704 A | 12/1998 |
| JP | 11121585 A | 4/1999 |
| JP | 2001332603 A * | 11/2001 |

| | | | |
|---|---|---|---|
| JP | 2003045090 A * | 2/2003 | |
| JP | 2004158687 A * | 6/2004 | |
| WO | WO 87/06561 A1 | 11/1987 | |
| WO | WO 97/03001 A1 | 1/1997 | |
| WO | WO 98/50946 A1 | 11/1998 | |
| WO | WO 98/59229 * | 12/1998 | |
| WO | WO 99/28952 A2 | 6/1999 | |
| WO | WO 99/57940 A2 | 11/1999 | |
| WO | WO 00/03416 A2 | 1/2000 | |
| WO | WO 00/03416 A3 | 1/2000 | |
| WO | WO 00/19493 A2 | 4/2000 | |
| WO | WO 00/44653 A1 | 8/2000 | |
| WO | WO 00/59004 A1 | 10/2000 | |
| WO | WO 00/67334 A1 | 11/2000 | |
| WO | WO 01/01828 A1 | 1/2001 | |
| WO | WO 01/10756 A1 | 2/2001 | |
| WO | WO 02/04774 A2 | 1/2002 | |

OTHER PUBLICATIONS

Koh, et al., "Wafer Handling with Levitation", Sep. 1992, Journal of Electronics Manufacturing, vol. 2, No. 3, pp. 101-107.

Martin, et al., "Design Criteria for 300 mm Silicon Wafer Carriers, Material Handling Systems & Tools", 1995, Proceedings of the 41st Annual Technical Meeting of the Institute of Environmental Sciences, pp. 107-117.

No-Author, "PRI Selected By Varian Semiconductor to Supply 300mm Integrated Front-End Buffering Solutions", Feb. 10, 2000, Newswire, p. 7434.

No-Author, "300mm Single-Wafer Handling" (Brief Article), Apr. 1, 2000, Solid State Technology, vol. 43, No. 4, p. 99.

No-Author, "Single-Wafer Transfer System Upgrade" (Brief Article), Sep. 15, 2001, Semiconductor International, vol. 24, No. 11, p. 92.

Shah et al., U.S. Appl. No. 12/398,178 (13234) filed on Mar. 4, 2009.

* cited by examiner

METHODS AND APPARATUS FOR MAPPING CARRIER CONTENTS

The present application claims priority from U.S. Provisional Patent Application Ser. No. 60/607,288, filed Sep. 4, 2004, which is hereby incorporate by reference herein in its entirety.

FIELD OF THE INVENTION

The present invention relates generally to semiconductor device manufacturing, and more particularly to methods and apparatus mapping carrier contents.

BACKGROUND

Manufacturing of semiconductor devices typically involves performing a sequence of procedures with respect to a substrate such as a silicon substrate, a glass plate, etc. These steps may include polishing, deposition, etching, photolithography, heat treatment, and so forth. Usually a number of different processing steps may be performed in a single processing system or "tool" which includes a plurality of processing chambers. However, it is generally the case that other processes are required to be performed at other processing locations within a fabrication facility, and it is accordingly necessary that substrates be transported within the fabrication facility from one processing location to another. Depending on the type of semiconductor device to be manufactured, there may be a relatively large number of processing steps required, to be performed at many different processing locations within the fabrication facility.

It is conventional to transport substrates from one processing location to another within substrate carriers such as sealed pods, cassettes, containers and so forth. It is also conventional to employ automated substrate carrier transport devices, such as automatic guided vehicles, overhead transport systems, substrate carrier handling robots, etc., to move substrate carriers from location to location within the fabrication facility or to transfer substrate carriers from or to a substrate carrier transport device.

In normal operation, a substrate carrier or cassette may include several empty substrate slots. During use of such a substrate carrier, time may be wasted having an end effector of a pick and place robot enter the carrier to access a substrate that is not in fact there. Accordingly, a need exists for methods and apparatus for determining and/or mapping the contents of a substrate carrier.

SUMMARY OF THE INVENTION

In a first aspect of the invention, a first method of mapping contents of a substrate carrier is provided. The first method includes the steps of (1) coupling a sensor to the substrate carrier or a loadport adapted to receive the substrate carrier; and (2) determining a presence or absence of a substrate in a slot of the substrate carrier using the sensor.

In a second aspect of the invention, a first apparatus for mapping contents of a substrate carrier is provided. The first apparatus includes (1) a substrate carrier having a slot adapted to support a substrate; and (2) a sensor coupled to the substrate carrier or a loadport adapted to receive the substrate carrier. The apparatus is adapted to determine a presence or absence of a substrate in the slot of the substrate carrier using the sensor.

In a third aspect of the invention, a second apparatus is provided. The second apparatus is a substrate carrier including (1) a slot for supporting a substrate; and (2) a feature adapted to interact with a sensor such that the sensor may be used to determine a presence or absence of a substrate in the slot of the substrate.

In a fourth aspect of the invention, a third apparatus is provided. The third apparatus includes (1) a loadport; and (2) a sensor coupled to the loadport and adapted to detect a presence or absence of a substrate in a slot of a substrate carrier when the substrate carrier is coupled to the loadport.

In a fifth aspect of the invention, a first system for mapping contents of a substrate carrier is provided. The first system includes: (1) a loadport; (2) a substrate carrier, having a slot for supporting a substrate, coupled to the loadport; and (3) a sensor coupled to the substrate carrier or the loadport. The system is adapted to determine a presence or absence of a substrate in the slot of the substrate carrier using the sensor. Numerous other aspects are provided in accordance with these and other aspects of the invention.

Other features and aspects of the present invention will become more fully apparent from the following detailed description, the appended claims and the accompanying drawings.

DETAILED DESCRIPTION OF THE PRESENT INVENTION

Figure 1A:
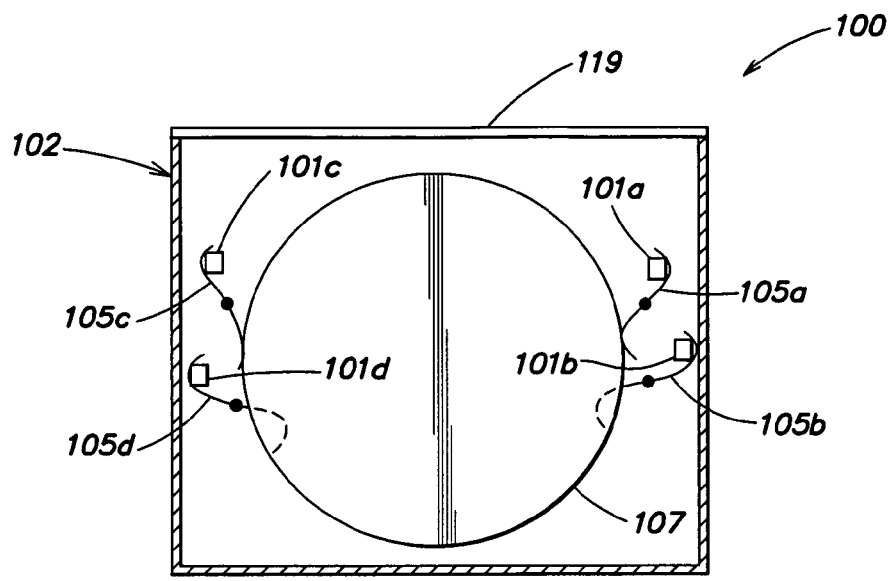
FIGS. 1A-B are respective top and cross-sectional side views of a first exemplary apparatus for mapping contents of a substrate carrier in accordance with an embodiment of the present invention.

The present invention provides improved methods and apparatus for determining the location of substrates and other work pieces and/or devices within a substrate carrier. A substrate carrier may include any number of slots that are adapted to securely hold substrates. A substrate may include, for example, a glass plate, a polymer substrate, a semiconductor wafer, a mask, a reticule or the like.

The inventive apparatus comprises a substrate carrier or a loadport that comprises one or more sensors positioned on the substrate carrier or loadport so as to sense whether or not a substrate is positioned in one or more slots of the substrate carrier. Because the sensor(s) are mounted on either the substrate carrier or on/at the loadport itself, mapping may be performed without the additional time required of prior art mapping systems. Many different types of sensors may be employed such as magnetic, electric, optical (reflective or through beam), etc. and their position relative to the substrate carrier or loadport may vary accordingly. In optical sensing embodiments the substrate carrier may be adapted so that an optical signal or light beam may be transmitted from a first side of the substrate carrier and received at either the first side (e.g., via reflection off a substrate or other surface) or at a second side of the substrate carrier (topside, bottom side, right side, left side, front side, back side, etc.). The second side may be opposite the first side if the system is adapted such that the signal reflects at an angle (or in through-beam embodiments). Further, depending on the positioning of the sensor(s), the sensor(s) may detect whether a substrate is present in a slot and/or whether a substrate is properly positioned (seated) in a slot. An electric sensor, such as a switch, may be adapted to detect and/or complete an electrical connection.

In a manufacturing system one or more substrate carriers may be transported to a loadport to allow an end effector (e.g., of a robotic arm) to remove individual substrates from the carrier. In one embodiment, the end effector is under the control of a controller that uses a map to access the locations of the substrates within the carriers. The map may be generated using the various methods and apparatus described herein.

A map of a substrate carrier may be determined using the sensors of the present invention and transmitted to the controller (e.g., electrically via a signal path) before or after a door of the carrier is opened. The signal path may be established when one or more carriers are docked at a loadport and electrical contact between the carrier(s) and controller are established via the loadport. Other methods of transmitting the map to the controller may be used such as radio frequency, optical, infrared and/or other signal types.

The map may be determined via compiling information from one or more sensors disposed within and/or on the carrier and/or the loadport. In some embodiments, each slot within a substrate carrier may include a sensor that indicates the presence of a substrate. For example, each slot may include a biased tab or similar structure that is displaced from a first position to a second position when a substrate (and/or other device) is present in the slot. In such embodiments, the tabs may interrupt an optical, magnetic, or other signal when disposed in one of the two positions. This signal interruption or transmission path blocking may be used to determine the presence of a substrate in a particular slot of the carrier. The carrier, loadport, and/or a separate controller (e.g., a mapping controller) may store this information and/or use it to generate a map.

Figure 1B:
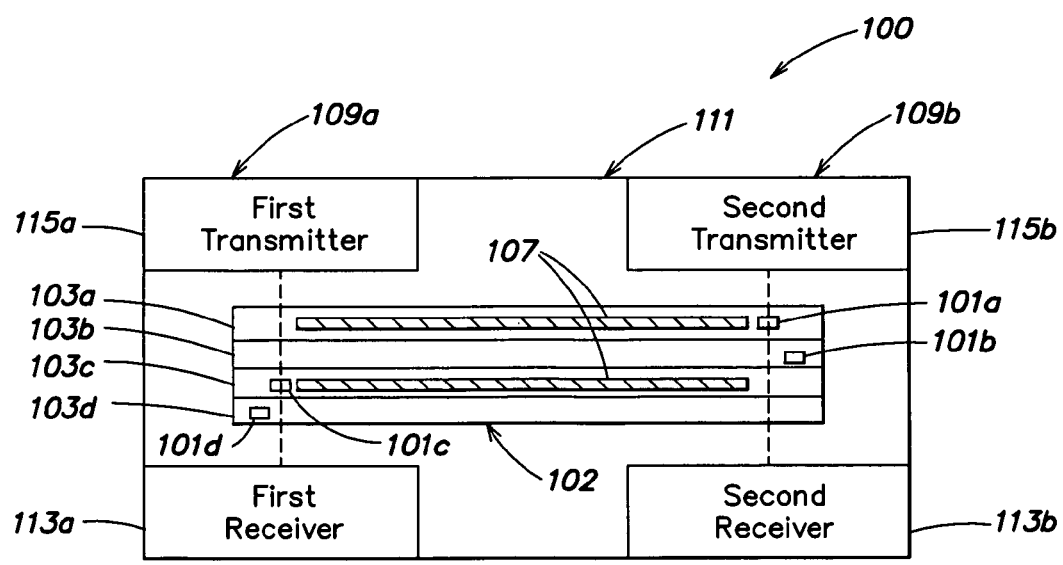

FIGS. 1A-B are respective top and cross-sectional side views of a first exemplary apparatus 100 for mapping contents of a substrate carrier in accordance with an embodiment of the present invention. With reference to FIGS. 1A-B, in some embodiments, a tab 101a-d of a substrate carrier 102 located adjacent to a slot 103a-d and biased by a pivot or leaf spring 105a-d toward an "empty" position (e.g., see slots 103b and 103d in FIG. 1B), may be displaced or deflected to a "loaded" position when a substrate 107 is in the slot 103a-d (e.g., see slots 103a and 103c in FIG. 1B). In the loaded position, a tab 101a-d is forced to obtrude such that the beam of a through-beam sensor 109a-b on a loadport 111 that supports the carrier 102 is blocked so that the beam cannot reach the sensor's receiver 113a-b after being transmitted by the sensor's transmitter 115a-b (e.g., see slots 103a and 103c in FIG. 1B). If no substrate 107 is present in a slot 103a-d, the respective tab 101a-d remains retracted in the empty position, being biased by the pivot spring 105a-d, and the light from the sensor's transmitter 115a-b can reach the sensor's receiver 113a-b such that the sensor 109a-b may be used to determine the absence of a substrate 107 in the slot (e.g., see slots 103b and 103d in FIG. 1B).

While four slots 103a-d and four tabs 101a-d are shown in FIGS. 1A-1B, it will be understood that substrate carriers having any number of slots (e.g., 1, 2, 3, 4, 5, 6 or more) may be similarly configured and that more or fewer than one tab per slot may be used.

Examples of commercially available through-beam sensors suitable for use with some embodiments of the present invention include the Model OZDK, OHDK, OSDK, and OEDK sensors manufactured by Baumer Electric AG of Frauenfeld, CH. An example of a reflective sensor suitable for use in some embodiments includes the Model OPDM sensor also manufactured by Baumer Electric. Other Sensors may be used.

In embodiments that include tabs 101 that indicate the presence and/or absence of a substrate 107 in a carrier 102, the tabs 101 may be disposed adjacent to slots 103 but staggered in their positioning relative to each other such that from a top or bottom perspective view of the carrier 102 (either from above or below, e.g. FIG. 1A) each individual tab 101 is separately visible even though the individual substrates 107 may not be. Such an arrangement may allow, for example, one or more through-beam sensors 109 mounted on the top and/or bottom of a plurality of carriers 102 and/or a loadport 111 to detect which tabs 101 of each carrier 102 are displaced and thus, the presence of individual substrates 107 in multiple carriers that are stacked on top of each other. In embodiments wherein sensors 109 are mounted on a loadport 111, each carrier 102 may include one or more windows (or clear surfaces) on top and/or bottom to allow the sensor 109 to determine the position of the tabs 101. In this manner, contents of one or more carriers may be determined without opening a door 119 of any carrier.

In another embodiment the presence or absence of a substrate 107 (and/or other device) may be indicated by an electrical switch and/or the closure of a circuit. In such embodiments for example, the weight of a substrate 107 may be used to force two contacts together such that zero electrical resistance (short circuit) across the contacts indicates the presence of a substrate 107 and infinite resistance (open circuit) indicates the absence of a substrate.

In other embodiments, multiple through-beam and/or reflective sensors 109 may be disposed along the sides of carriers and/or a loadport 111 to detect the presence of individual substrates 107 in multiple carriers stacked on top of each other.

Figure 2:
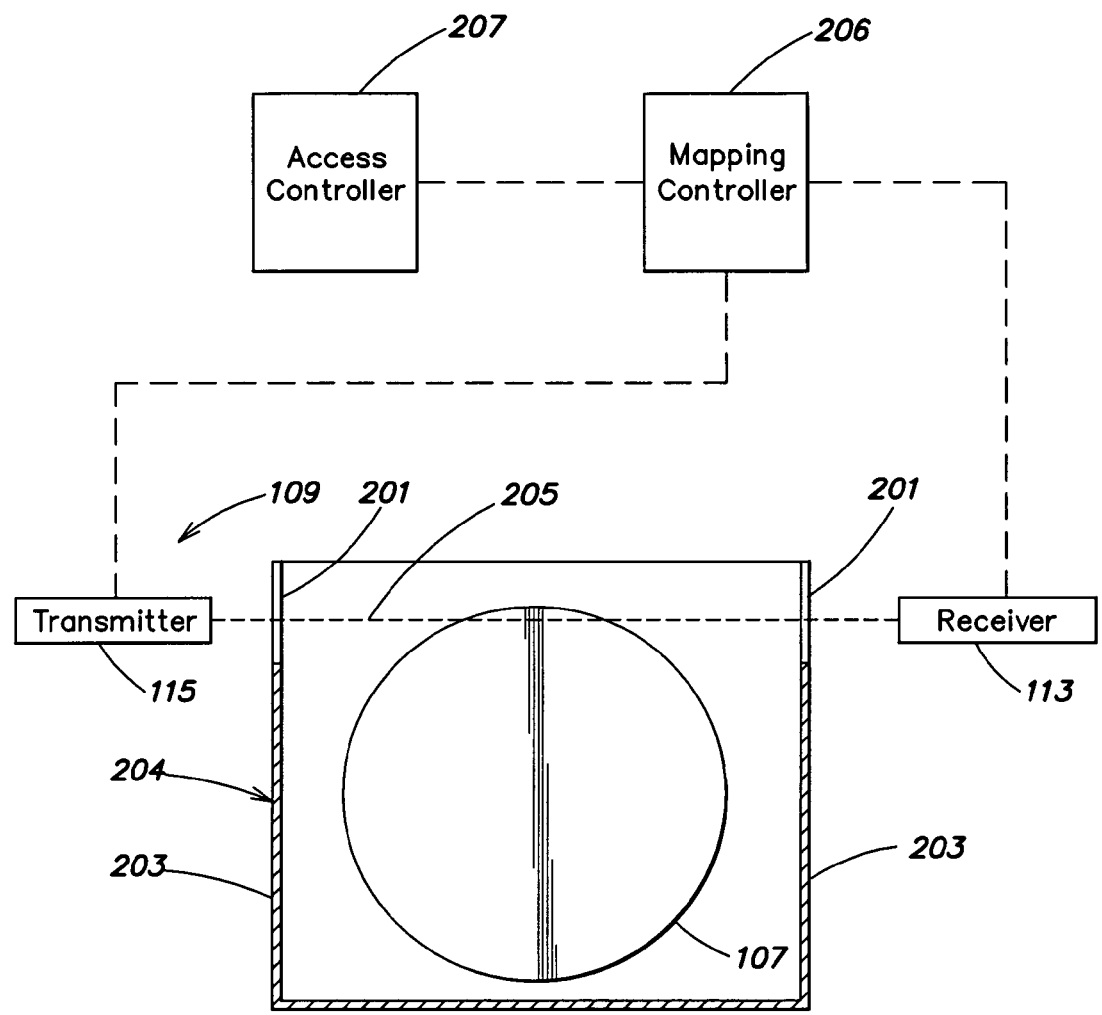
FIG. 2 is a top view of a second exemplary apparatus for mapping contents of a substrate carrier in accordance with an embodiment of the present invention.

FIG. 2 is a top view of a second exemplary apparatus 200 for mapping contents of a substrate carrier in accordance with an embodiment of the present invention. More specifically, FIG. 2 depicts an exemplary embodiment in which the edge (and/or other features) of substrates 107 may be detected directly using through-beam sensors 109 via windows 201 in the sides 203 of a carrier 204. In FIG. 2, the presence of a substrate 107, for example, would prevent a beam 205 from the transmitter portion 115 of sensor 109 from reaching the receiver portion 113 of the sensor 109. Information about the presence of substrates in one or more slots of one or more substrate carriers may be provided to a mapping controller 206 coupled to the sensor 109. Based on such information, the mapping controller 206 is adapted to create a map of the contents of the carrier 204. The sensors 109a-b of FIGS. 1A-1B may be similarly configured to supply information to a mapping controller for use during mapping of the contents of the carrier 204.

The present invention may facilitate immediate determination of the slot locations of substrates 107 in one or more carriers. Thus, an access controller 207 (e.g., used to control unloading of substrates from or loading of substrates into a carrier at a loadport) may receive from a carrier and/or loadport a map indicating the arrangement of the substrates 107 within that carrier without having to take time, or use resources, to scan each individual slot within the carrier. Therefore, the present invention may be used to enhance throughput of electronic device manufacturing systems by eliminating the time that prior art systems require to scan carrier slots and by freeing resources (e.g., robots previously used to map substrates) to perform tasks other than substrate mapping. Although the mapping controller 206 is shown separate from the access controller 207, in some embodiments, the controllers may be combined into a single controller.

Figure 3:
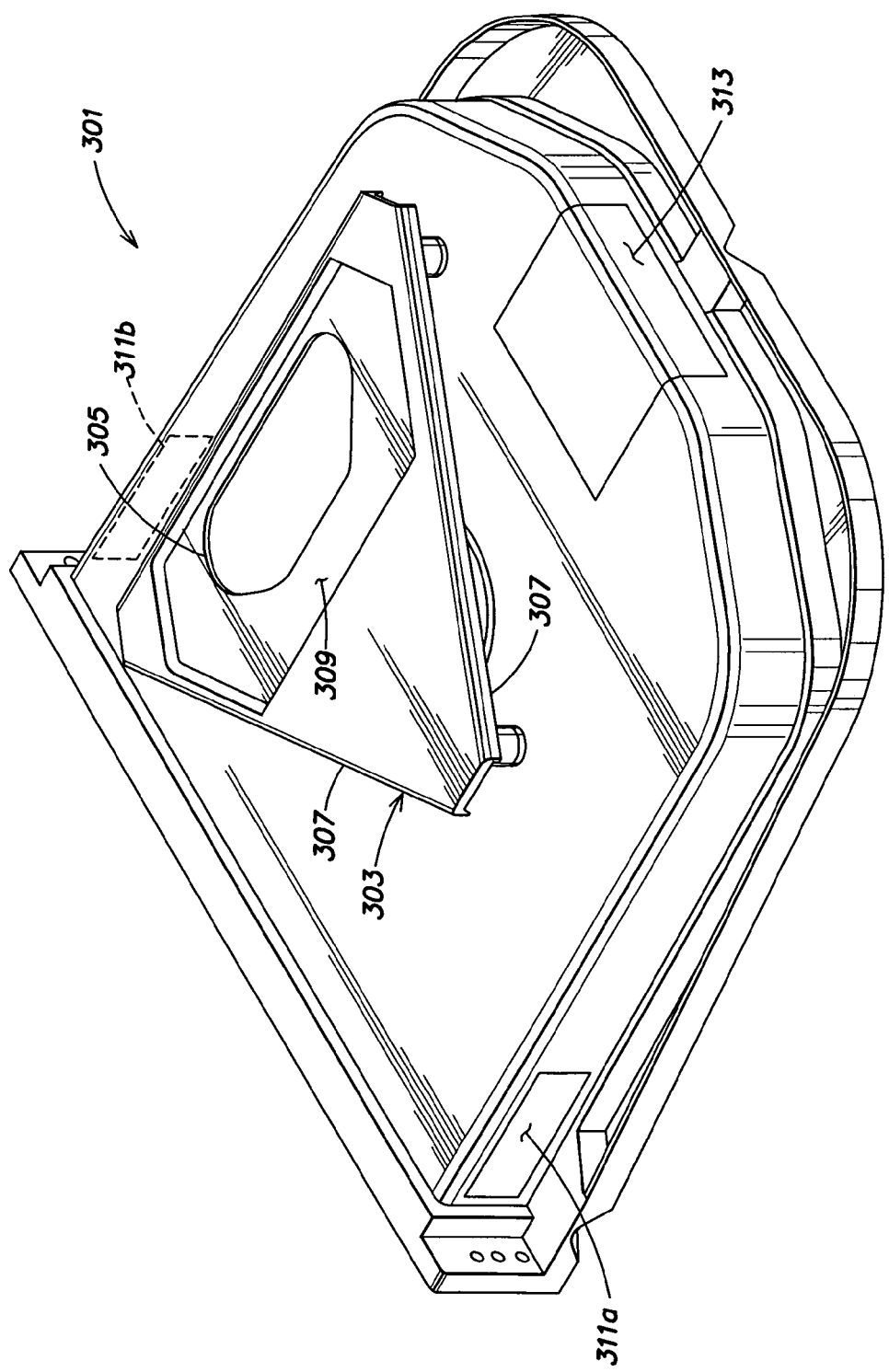
FIG. 3 is a perspective illustration depicting a small lot carrier including a delta-shaped flange in accordance with an embodiment of the present invention.

FIG. 3 is a perspective illustration depicting a small lot size carrier 301 including a delta-shaped flange 303 in accordance with an embodiment of the present invention. In some embodiments, the flange 303 may include a cut-out 305 to allow a human operator to easily grip the flange 303. This cut-out 305 may allow convenient handling of the carrier 301 without having to contact potentially sharp edges 307 of the flange 303 which may be designed for machine engagement of the flange 303 by a cradle (not pictured) in an overhead transport (OHT) system. (See, for example, U.S. Patent Publication No. US 2005-0040662, filed Jan. 26, 2004, and published Feb. 24, 2005, and titled "Overhead Transfer Flange and Support for Suspending Substrate Carrier", which is hereby incorporated by reference herein in its entirety.) The flange 303 may additionally include a recessed area 309.

As shown in FIG. 3, the small lot size carrier 301 may include a first window 311a and/or a second window 311b (shown in phantom) for receiving a light beam (that may be used to determine the presence and/or location of a substrate within the carrier 301 via reflection or transmission of the light beam as previously described). An additional window 313 may be provided on the carrier 301 to allow for visual inspection of the contents of the carrier 301. In at least one embodiment, the windows 311a-b and/or 313 may be formed from polycarbonate or another plastic, or from any other suitable material. Such windows also may be provided on large lot size substrate carriers.

As used herein, a "small lot" size substrate carrier refers to a substrate carrier that is adapted to hold significantly fewer substrates than a conventional "large lot" size substrate carrier which typically holds 13 or 25 substrates. As an example, in one embodiment, a small lot size substrate carrier is adapted to hold 5 or less substrates. Other small lot size carriers may be employed (e.g., small lot size carriers that hold 1, 2, 3, 4 or more than five substrates, but significantly less than that of a large lot size substrate carrier). In general, each small lot size substrate carrier may hold too few substrates for human transport of substrates carriers to be viable within a semiconductor device manufacturing facility.

Figure 4:
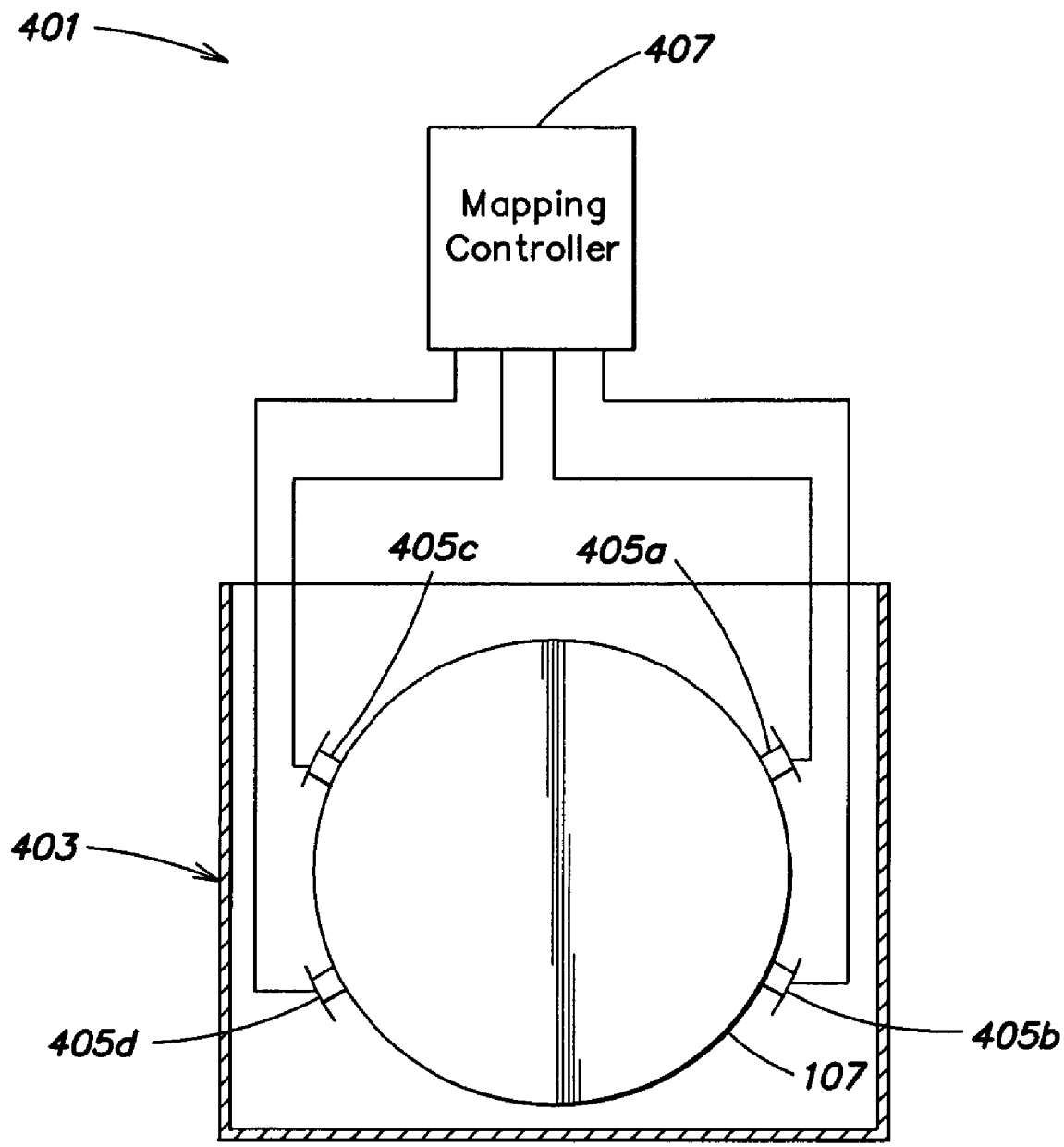
FIG. 4 is a top view of a third exemplary apparatus for mapping contents of a substrate carrier in accordance with an embodiment of the present invention.

FIG. 4 is a top view of a third exemplary apparatus for mapping contents of a substrate carrier in accordance with an embodiment of the present invention. With reference to FIG. 4, the third exemplary apparatus 401 may be similar to the first exemplary apparatus 101. For example, the third exemplary apparatus 401 may include a substrate carrier 403 including one or more slots adapted to support a substrate 107. However, the third exemplary apparatus 401 may include one or more switches and/or circuits 405a-d adapted to indicate the presence or absence of a substrate 107 (and/or other device) in a slot of the substrate carrier 403 (e.g., by closure of the electrical switch and/or circuit). The switch and/or circuit 405a-d may be positioned such that a weight of the substrate 107 may be used to force two contacts included in the switch or circuit 405a-d together such that zero electrical resistance (short circuit) across the contacts indicates the presence of a substrate 107 and infinite resistance (open circuit) indicates the absence of the substrate in a slot of the carrier. Additionally or alternatively, the presence of a substrate 107 (and/or other device) may complete the electrical circuit. The one or more switches and/or circuits 405a-d may couple to a controller 407 which may be adapted to create a map based on information about the presence and/or absence of a substrate in each slot of the substrate carrier 403. The map may identify, for example, the status of each slot in the substrate carrier (e.g., contains a properly positioned substrate, contains an improperly positioned substrate, contains no substrate, etc.) and/or may be generated before the carrier 403 is opened. Additionally or alternatively, the controller 407 may be adapted to employ the map to access one or more substrates in the substrate carrier 403 (e.g., by controlling an end effector at a load port based on the map).

The foregoing description discloses only exemplary embodiments of the invention. Modifications of the above disclosed apparatus and methods which fall within the scope of the invention will be readily apparent to those of ordinary skill in the art. For example, fewer or more sensors may be used and/or other sensor locations may be used. Also, more than one sensor, tab, switch, etc., per slot may be employed. Accordingly, while the present invention has been disclosed in connection with exemplary embodiments thereof, it should be understood that other embodiments may fall within the spirit and scope of the invention, as defined by the following claims.

The invention claimed is:

1. A method comprising:
    positioning a sensor on a substrate carrier; and
    determining a presence or absence of a substrate in a slot of the substrate carrier using the sensor, wherein the substrate carrier includes a tab structure in the slot, the tab structure configured to displace from a first position to a second position when a substrate is present in the slot and interrupt a signal of the sensor when in the first or second position; and determining a presence or absence of a substrate in the slot of the substrate carrier using the sensor includes determining the presence or absence of a substrate in the slot of the substrate carrier based on interruption of the signal by the tab structure.

2. The method of claim 1 wherein determining a presence or absence of a substrate in the slot of the substrate carrier using the sensor includes determining a presence or absence of a substrate in the slot of the substrate carrier using the sensor before opening a door of the substrate carrier.

3. The method of claim 1 wherein the sensor includes an optical sensor configured to transmit a light beam into the substrate carrier to determine a presence or absence of a substrate.

4. The method of claim 3 wherein determining a presence or absence of a substrate in the slot of the substrate carrier using the sensor includes transmitting an optical signal through the substrate carrier.

5. The method of claim 1 further comprising determining whether a substrate present in the substrate carrier is positioned in the slot using the sensor.

6. The method of claim 1 further comprising creating a map of the substrate carrier contents based on the presence or absence of a substrate in the slot of the substrate carrier.

7. The method of claim 6 further comprising transmitting the map to a controller configured to employ the map to access the substrate carrier.

8. The method of claim 1 wherein:
    determining the presence or absence of a substrate in the slot of the substrate carrier based on interruption of the signal by the tab structure includes determining the presence or absence of a substrate in the slot of the substrate carrier through a window of the substrate carrier based on interruption of the signal by the tab structure.

9. The method of claim 1 further comprising:
positioning an additional sensor on the substrate carrier; and
determining a presence or absence of another substrate in an additional slot of the substrate carrier using the additional sensor.

10. The method of claim 9 further comprising creating a map of the substrate carrier contents based on the presence or absence of substrates in respective slots of the substrate carrier.

11. An apparatus comprising:
a substrate carrier having a slot configured to support a substrate; and
a sensor positioned on the substrate carrier;
wherein the apparatus is configured to determine a presence or absence of a substrate in the slot of the substrate carrier using the sensor, and wherein the substrate carrier includes a tab structure in the slot, the tab structure configured to displace from a first position to a second position when a substrate is present in the slot and interrupt a signal of the sensor when in the first or second position; and the apparatus is further configured to determine the presence or absence of a substrate in the slot of the substrate carrier based on interruption of the signal by the tab structure.

12. The apparatus of claim 11 further including structure capable of being used to determine a presence or absence of a substrate in the slot of the substrate carrier using the sensor before a door of the substrate carrier is opened.

13. The apparatus of claim 11 wherein the sensor includes an optical sensor configured to transmit a light beam into the substrate carrier to determine a presence or absence of a substrate.

14. The apparatus of claim 13 wherein the apparatus is further configured to determine a presence or absence of a substrate in the slot of the substrate carrier using the sensor by transmitting an optical signal through the substrate carrier.

15. The apparatus of claim 11 further including structure capable of being used to determine whether a substrate present in the substrate carrier is positioned in the slot using the sensor.

16. The apparatus of claim 11 further comprising a mapping controller configured to create a map of the substrate carrier contents based on the presence or absence of a substrate in the slot of the substrate carrier.

17. The apparatus of claim 16 further including structure capable of being used to transmit the map to a controller configured to employ the map to access the substrate carrier.

18. The apparatus of claim 11 wherein:
the substrate carrier includes a window; and
the apparatus is further configured to determine the presence or absence of a substrate in the slot of the substrate carrier through the window.

19. The apparatus of claim 11 further comprising:
an additional slot in the substrate carrier; and
an additional sensor positioned on the substrate carrier;
wherein the apparatus is further configured to determine a presence or absence of another substrate in the additional slot of the substrate carrier using the additional sensor.

20. The apparatus of claim 19 further comprising a mapping controller configured to create a map of the substrate carrier contents based on the presence or absence of substrates in respective slots of the substrate carrier.

21. A substrate carrier, comprising:
a slot configured to support a substrate; and
a feature configured to interact with a sensor such that the sensor may detect a presence or absence of a substrate in the slot of the substrate; and
wherein the sensor is positioned on the substrate carrier and wherein the feature is a tab structure coupled to the slot and configured to displace from a first position to a second position when a substrate is present in the slot and interrupt a signal of the sensor when in the first or second position.

* * * * *